United States Patent [19]
Bedarida et al.

[11] Patent Number: 5,793,676
[45] Date of Patent: Aug. 11, 1998

[54] NONVOLATILE MEMORY DEVICE HAVING SECTORS OF SELECTABLE SIZE AND NUMBER

[75] Inventors: Lorenzo Bedarida, Vimercate; Giovanni Campardo, Bergamo; Giuseppe Fusillo; Andrea Silvagni, both of Milan, all of Italy

[73] Assignee: SGS-Thomson Microelectronics S.r.l., Agrate Brianza, Italy

[21] Appl. No.: 649,857

[22] Filed: May 3, 1996

[30] Foreign Application Priority Data

May 5, 1995 [EP] European Pat. Off. ............ 95830184

[51] Int. Cl.⁶ .................................................. G11C 11/34
[52] U.S. Cl. .................................. 365/185.12; 365/185.33
[58] Field of Search ................... 365/185.33, 185.29, 365/185.11

[56] References Cited

U.S. PATENT DOCUMENTS

| | | | |
|---|---|---|---|
| 4,130,890 | 12/1978 | Adam | 365/184 |
| 4,271,487 | 6/1981 | Craycraft | 365/185.07 |
| 5,117,269 | 5/1992 | Bellezza et al. | 357/23.5 |
| 5,245,570 | 9/1993 | Fazio et al. | 365/185 |
| 5,267,196 | 11/1993 | Talreja et al. | 365/185.11 |
| 5,363,330 | 11/1994 | Kobayashi et al. | 365/185.11 |
| 5,388,069 | 2/1995 | Kokubo | 365/185.26 |
| 5,392,252 | 2/1995 | Rimpo et al. | 365/230.02 |
| 5,394,362 | 2/1995 | Banks | 365/185.33 |
| 5,418,752 | 5/1995 | Harari et al. | 365/185.11 |
| 5,574,684 | 11/1996 | Tomeda | 365/185.11 |

FOREIGN PATENT DOCUMENTS

| | | |
|---|---|---|
| 0 369 829 A2 | 5/1990 | European Pat. Off. |
| 0 422 347 A3 | 4/1991 | European Pat. Off. |
| 0 509 696 A2 | 10/1992 | European Pat. Off. |
| 0 522 780 A2 | 1/1993 | European Pat. Off. |
| 0 552 531 A1 | 7/1993 | European Pat. Off. |
| WO 94/14196 | 6/1994 | WIPO. |

OTHER PUBLICATIONS

Eitan, Boaz et al; "Alternate Metal Virtual Ground (AMG)–A New Scaling Concept for Very High–Density EPROM's," *IEEE Electron Device Letters*, vol. 12, No. 8, Aug., 1991, pp. 450–452.

Kammerer, W. et al., "A new Virtual Ground Array Architecture for Very High Speed, High density EPROMS," IEDM 1991, *Digest of Technical Papers*, Dec. 1991, pp. 83–84.

*Primary Examiner*—David C. Nelms
*Assistant Examiner*—Michael T. Tran
*Attorney, Agent, or Firm*—David V. Carlson; Bryan A. Santarelli; Seed and Berry LLP

[57] ABSTRACT

A memory array is divided, at the design stage, into a plurality of elementary sectors; depending on the specific application and the requirements of the user, the elementary sectors are grouped into composite sectors of desired size and number; a correlating unit memorizes the correlation between each composite sector and the elementary sectors; and, to address a composite sector, the relative address is supplied to the correlating unit which provides for addressing the elementary sectors associated with the addressed composite sector on the basis of the memorized correlation table.

22 Claims, 5 Drawing Sheets

NONVOLATILE MEMORY DEVICE HAVING SECTORS OF SELECTABLE SIZE AND NUMBER

TECHNICAL FIELD

The present invention relates to a nonvolatile memory device with sectors of preselectable size and number.

BACKGROUND OF THE INVENTION

As is known, flash-EPROM memories are becoming increasingly important on account of being programmable and erasable electrically. At present, the cells are written by channel hot electron injection, and are erased by Fowler-Nordheim tunneling. In particular, erasing is carried out by applying a high voltage to the source terminal of the cells, with the drain terminal floating and the gate terminal grounded, or by applying a high negative voltage to the gate terminal, with the source terminal grounded or at a medium-high positive voltage, and the drain terminal floating.

At present, flash memories are divided into sectors, with the source terminals of all the cells in the same sector connected to the same source line, so that all the cells in the same sector are erased simultaneously, and the number and size of the sectors (number of bits in each sector) are fixed and unchangeable.

To give a better idea of the problems with the prior art, FIGS. 1 and 2 show the typical architecture of a known flash-EPROM memory device 1.

As shown in FIGS. 1 and 2, known nonvolatile memory device 1 comprises a memory array 2 formed of a number of memory cells 3 arranged in rows and columns and grouped into sectors 4. Each memory cell 3 presents a drain terminal 10 connected to a respective bit line 11, a gate terminal 12 connected to a respective word line 13, and a source terminal 14 connected to a common source line 15. Cells 3 in the same column are connected to the same bit line 11. Cells 3 in the same row are connected to the same word line 13, and cells 3 in the same sector are connected to the same common source line 15, so that each sector 4 presents a respective common source line. In the example shown, the sectors are organized in columns, i.e., the cells in the same column belong to the same sector, but the observations made herein also apply equally to sectors organized in rows.

Word lines 13 (shown schematically in FIG. 1 by arrow 18) are connected to a row decoder 19, which is supplied by a control unit 20 with the coded addresses of the rows to be biased, which addresses are supplied externally or generated inside unit 20 depending on the operation.

Similarly, all the bit lines 11 (shown schematically in FIG. 1 by arrow 22) are connected to a column decoder 21 addressed by control unit 20 so as to appropriately bias and connect bit lines 11 to output lines 23. Output lines 23 are connected to a sense amplify unit 24 also controlled by control unit 20, and which provides for reading the coded information in cells 3 addressed by the bit and word lines, and for supplying this information externally over an output bus 27.

Common source lines 15 are connected to respective switches 25 for grounding or connecting common source lines 15 to a high erase voltage. Switches 25 are controlled by an enabling sector 26, which is in turn controlled by control unit 20.

To erase a sector 4, enabling selector 26, controlled by control unit 20, enables the switch 25 connected to the sector 4 to be erased, so as to bias the source terminals 14 of all the cells at a high voltage (e.g., 12 V). At the same time, gate terminals 12 are grounded or brought to a negative voltage by word lines 13, and drain terminals 10 are left floating, so that all the cells in the sector are erased simultaneously.

As already stated, one drawback of a structure of this type is that the number of cells 3 in sectors 4 and the number of sectors 4 are determined at the design stage with no possibility of being altered, so that, for each customer requirement in terms of number and size of the sectors, memory device 1 must be specially designed, and can only be used for a limited number of applications involving similar requirements.

SUMMARY OF THE INVENTION

It is an object of the present invention to provide a nonvolatile memory device designed to overcome the aforementioned drawback.

According to one aspect of the present invention, a memory circuit includes a memory array that has a plurality of elementary memory sectors. Each memory sector includes a nonvolatile memory cell. A first plurality of erased switches are each coupled to a corresponding one of the elementary memory sectors. A second plurality of correlating registers are coupled to the array switches. Each correlating register finds a corresponding composite sector and identifies those of the elementary memory sectors that are part of the defined composite sector. The memory circuit also includes a control unit and a composite-sector selector coupled to the control unit and to the correlating registers.

BRIEF DESCRIPTION OF THE DRAWINGS

Two preferred, non-limiting embodiments of the present invention will be described by way of example with reference to the accompanying drawings, in which.

DETAILED DESCRIPTION OF THE INVENTION

Figure 3:
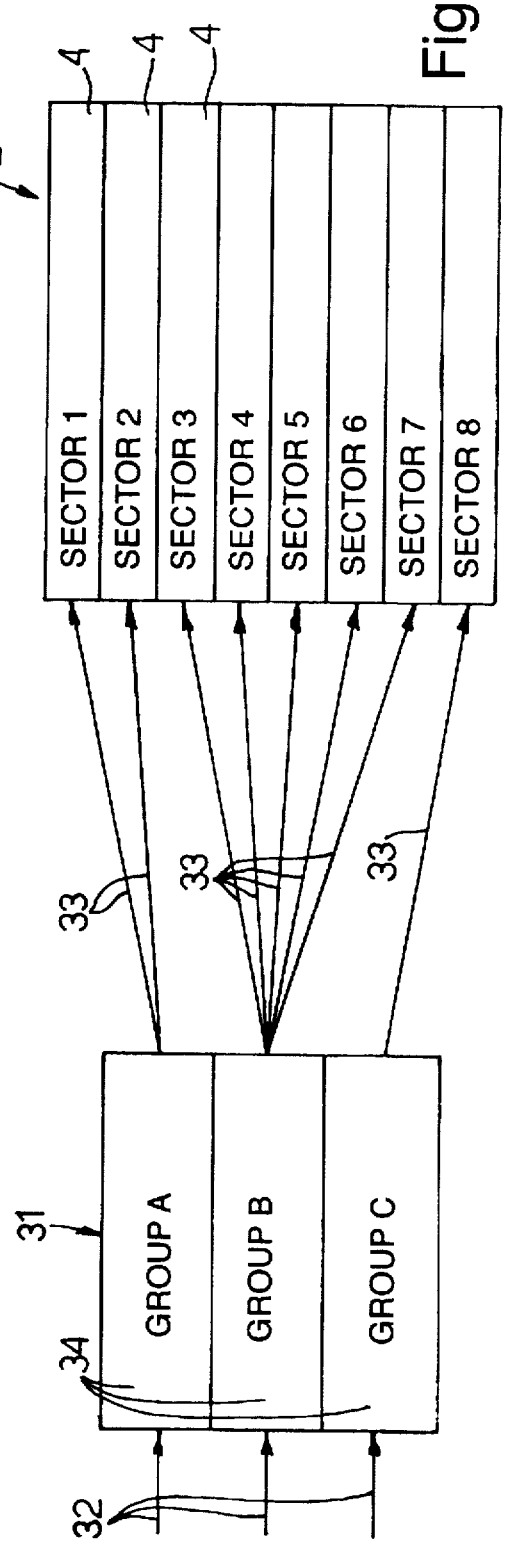
FIG. 3 shows a block diagram that illustrates the principles underlying the present invention.

FIG. 3 shows, schematically, the principle underlying the present invention, and which comprises dividing the memory (at the design stage) into a large number of elementary sectors of different sizes (in as flexible a manner as possible, according to potential customer requirements), and subsequently grouping the elementary sectors into composite sectors (groups of sectors) of a size and number corresponding to a specific application. A correlating unit provides for storing the correlation between each user-specified composite sector or group of sectors and the associated elementary sectors. The above concept is shown in FIG. 3 in which memory array 2 is shown as comprising eight sectors 4 grouped into three composite sectors 34 of two, five and one elementary sectors respectively. Block 31 indicates the correlation memory, the inputs (arrows 32) of which specify the address of the composite sector 34 to be, for example, erased, and the outputs (arrows 33) of which specify the addresses of the elementary sectors in the addressed composite sector. For the user, therefore, the FIG. 3 structure is equivalent to that of a memory array formed of only three appropriately sized composite sectors.

Figure 1:
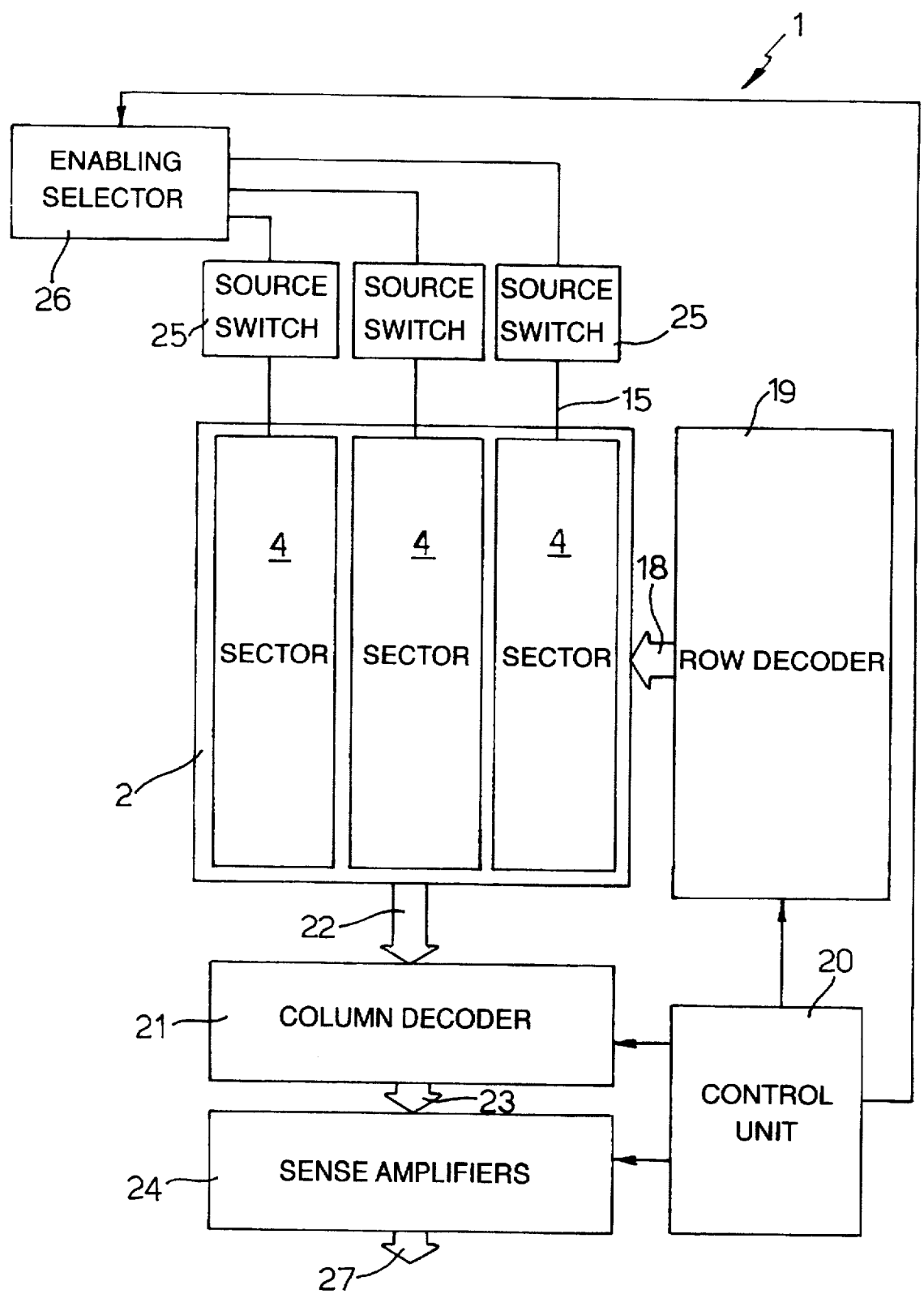
FIG. 1 shows the overall architecture of a known memory device.
Figure 2:
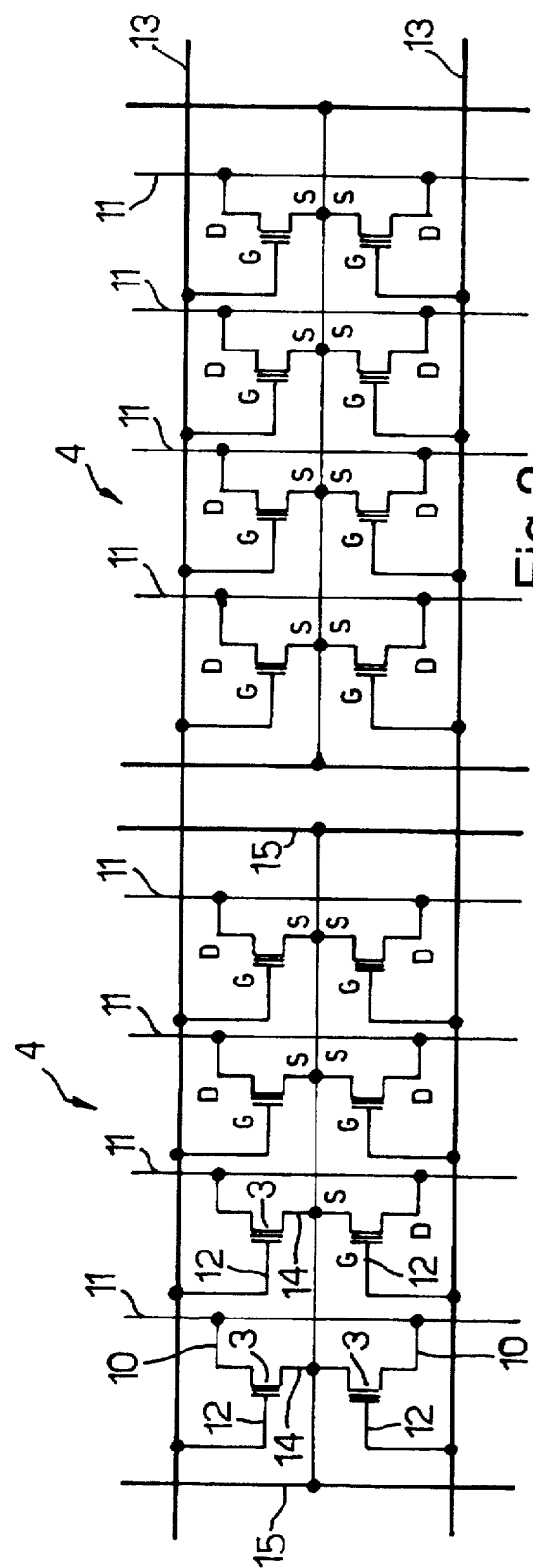
FIG. 2 shows a circuit diagram of a detail of the FIG. 1 device.
Figure 4:
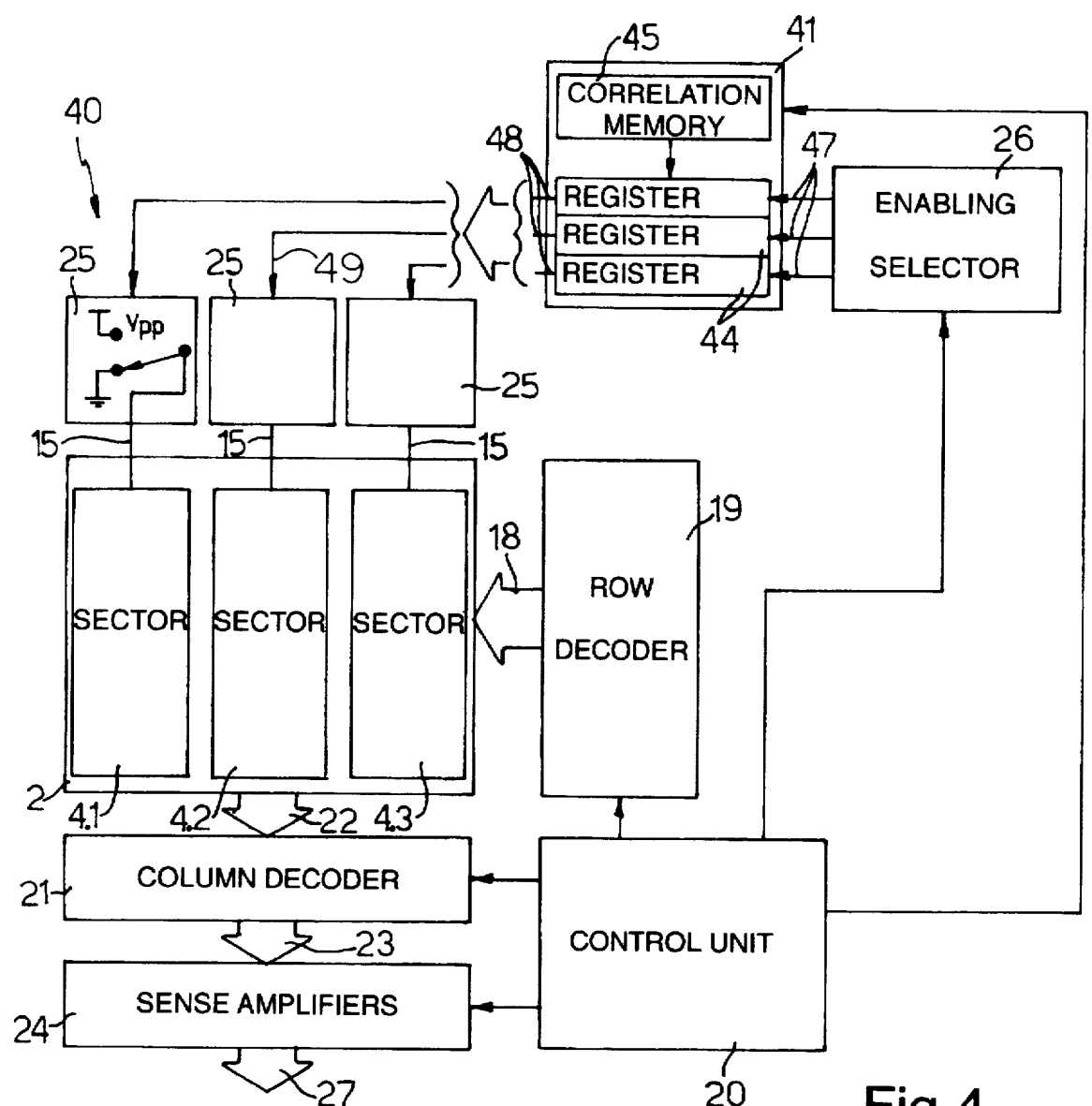
FIG. 4 shows a first embodiment of a memory device in accordance with the present invention.

FIG. 4 shows an example architecture implementing the FIG. 3 principle, and in which the elements common to the FIG. 1 architecture are indicated using the same numbering system with no further description.

The memory device 40 in FIG. 4 comprises a correlating unit 41 located between enabling selector 26 and source switches 25, and in turn comprising a number of registers 44, and a nonvolatile correlation memory 45. Each register is associated with a composite sector, and memorizes the respective associated elementary sectors. To this end, a register 44 is provided for each elementary sector 4 (to allow even all one-unit groups of sectors, i.e., associated with a single elementary sector), and each register 44 comprises a number of bits equal to the number of elementary sectors 4, so as to memorize in binary manner the correlation (if any) between the associated composite sector and each of the elementary sectors present. Each register 44 therefore presents an input 47 connected to enabling selector 26, and a number of outputs 48—one for each bit, i.e., one for each elementary sector 4. The outputs 48 of the various registers 44 associated with the same elementary sector 4 are connected to one another and to the control input 49 of the source switch 25 connected to the common source line 15 of the associated elementary sector.

Figure 5:
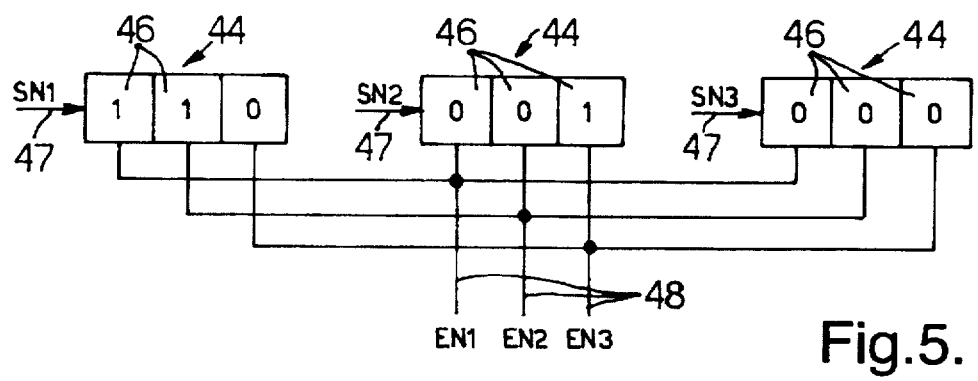
FIG. 5 shows one embodiment of a detail of the FIG. 4 device.

FIG. 5 shows a simplified example of the FIG. 4 case in which memory array 2 comprises three elementary sectors 4.1, 4.2, 4.3, and therefore three registers 44 with three memory locations or bits 46. In the example shown, elementary sectors 4 are assumed to be grouped into two composite groups or sectors: a first group comprising elementary sectors 4.1, 4.2 in FIG. 4, the switches 25 of which are controlled by signals EN1, EN2, and a second group including only elementary sector 4.3, the switch of which is controlled by signal EN3. Assuming this, one of registers 44 (to the left in FIG. 5) is associated with the first composite sector, and memorizes two logic ones, i.e., "1" in the bits 46 corresponding to the first two elementary sectors 4.1, 4.2, and a logic zero, i.e., "0" in bit 46 corresponding to the third elementary sector 4.3. A second register 44 (in the center in FIG. 5) is associated with the second group of sectors, and memorizes two "0" for the first two elementary sectors 4.1, 4.2, and a "1" for the third elementary sector 4.3. A third register (to the right in FIG. 5) memorizes all "0" by not being associated with any of the elementary sectors. Consequently, when the first register 44 (to the left in FIG. 5) is addressed by enabling selector 26 by means of signal SN1, logic signals corresponding to "110" are sent along lines 48 to switch switches 25 relative to sectors 4.1, 4.2 and, for example, bring the source lines 15 to a high voltage, whereas the switch 25 associated with the third elementary sector 4.3 is unaffected.

Correlation memory 45 provides for permanently storing the content of registers 44, which is lost when memory device 40 is turned off. When turned on, memory device 40 provides for transferring the content of correlation memory 45 into registers 44 in the same way as for normal loading operations in known memory devices.

Figure 6:
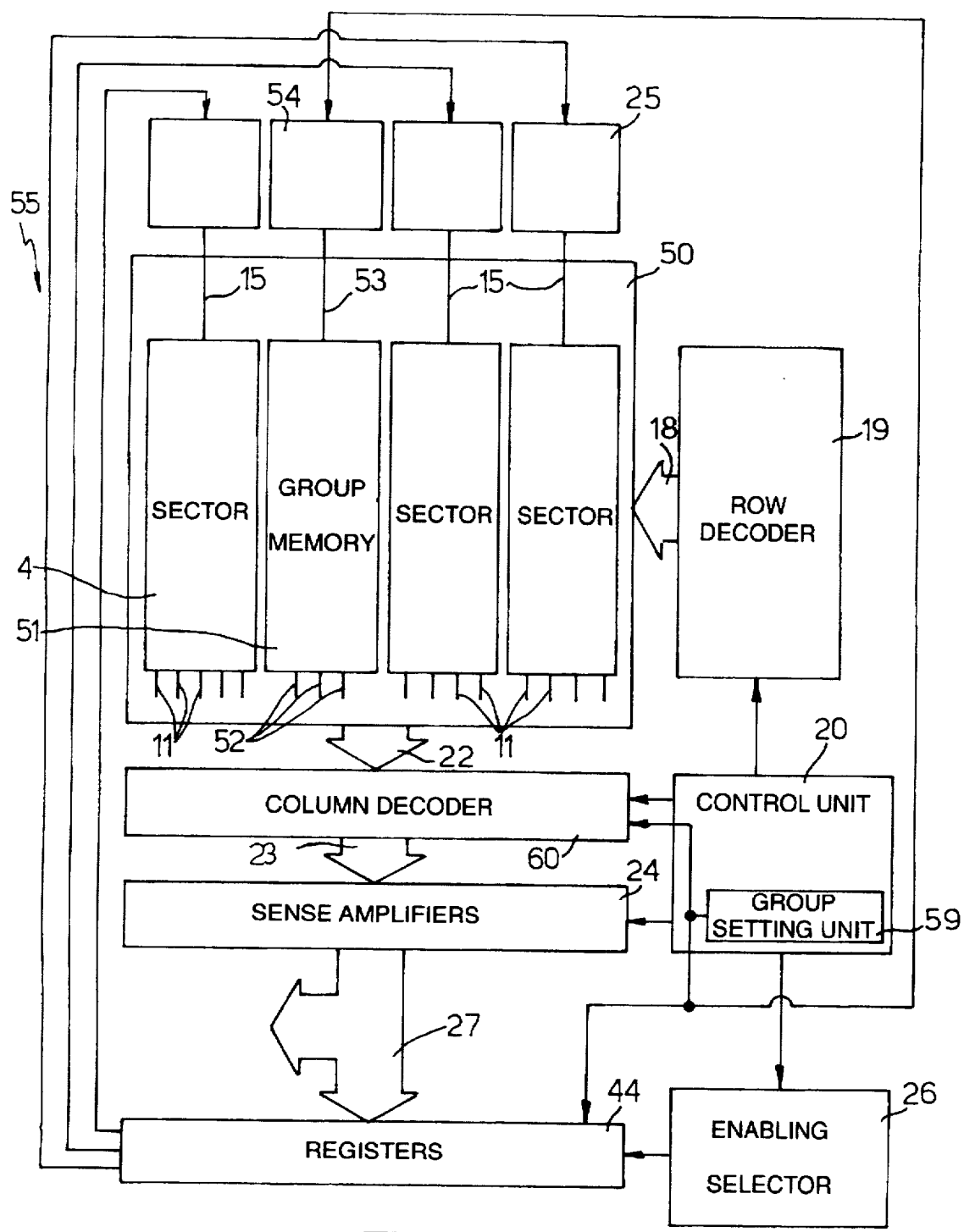
FIG. 6 shows a second embodiment of a memory device in accordance with the present invention.

FIG. 6 shows a further embodiment of the memory device according to the invention, wherein the correlation between the user-specified composite sectors and the elementary sectors into which the device is actually divided is again memorized in registers, and the content of the registers is memorized permanently by a memory element formed in the memory array.

In FIG. 6, the memory device 55 comprises a memory array 50 in turn comprising a plurality of elementary sectors 4, and a group memory sector 51 located between two elementary sectors 4 and connected to respective dedicated bit lines 52 as described in more detail later on with reference to FIG. 7. Group memory sector 51 is also connected to a respective common source line 53, which in turn is connected to a respective switch 54, which is substantially identical to switches 25 associated with the elementary sectors 4. In FIG. 6, the correlation registers 44 (shown by a single block) are connected to the output of sense amplifiers 24, but are otherwise identical to registers 44 in FIG. 4. Switch 54 is controlled by a group setting unit 59 shown here as forming part of control unit 20 of device 55. Unit 59 generates the control signal for switch 54 when group memory sector 51 is to be erased, and also controls the column decoder, here indicated by 60, the output bus 27, and registers 44 for initially loading the registers, and erasing and writing group memory sector 51.

Figure 7:
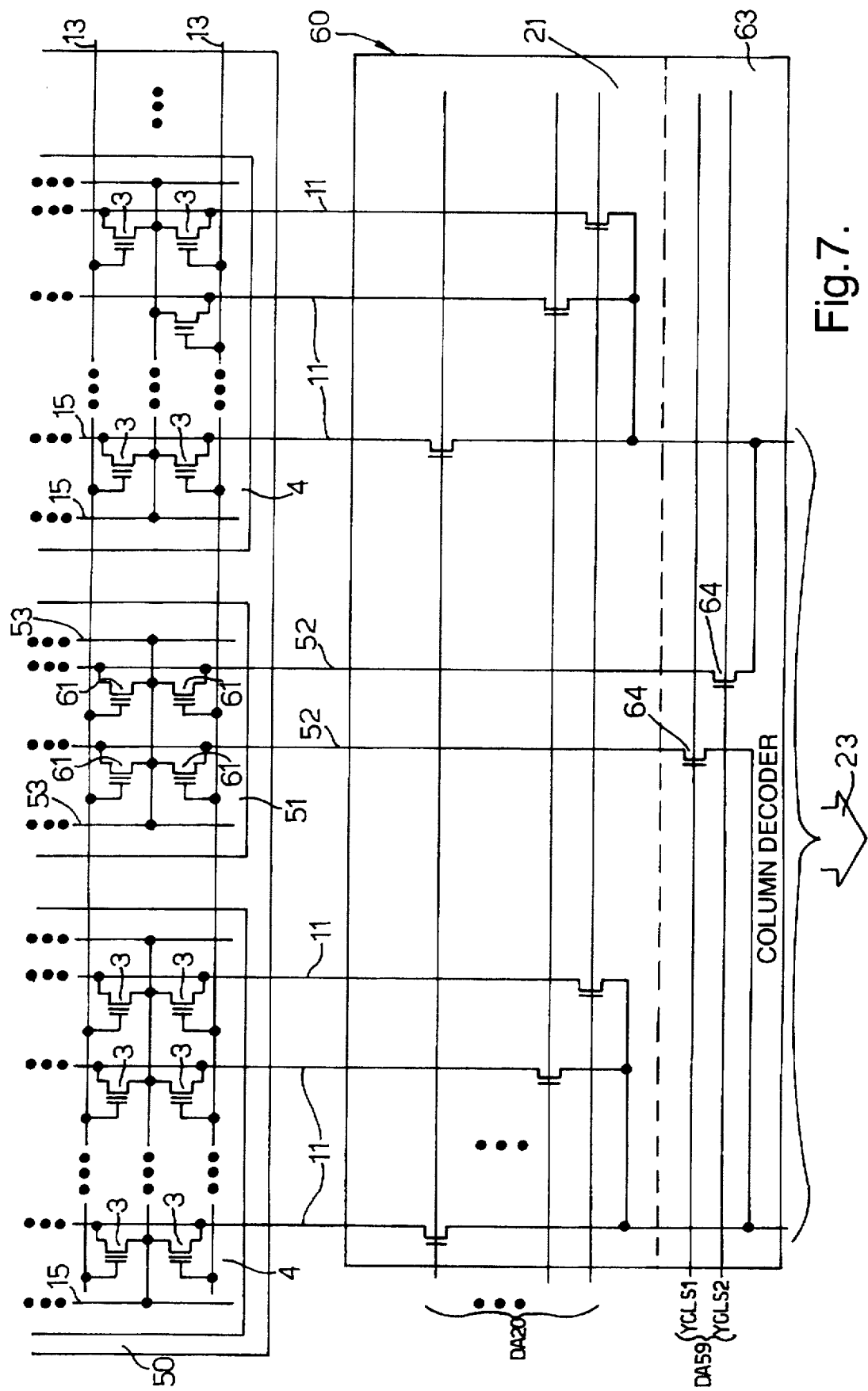
FIG. 7 shows the electric diagram of a detail in FIG. 6.

As shown more clearly in FIG. 7, group memory sector 51 comprises a plurality of cells 61, which are substantially identical to cells 3 and are connected to the same word lines 13 and to dedicated bit lines 52. Each dedicated bit line 52 is associated with an output line 23 of memory device 55 to make use of the sense circuits already provided for normal operation of memory device 55. For this purpose, group memory sector 51 requires a special column decoder, as shown schematically in FIG. 7, wherein column decoder 60 is divided into a first portion for decoding elementary sectors 4 (in conventional manner as in FIGS. 1, 4, and therefore indicated 21), and a second portion 63 for decoding group memory sector 51. Portion 63 comprises selection transistors 64 along group bit lines 52—one for each line 52—controlled by signals YCLS generated by group setting unit 59 (FIG. 6) so as to connect each line 52 to a respective output line (arrow 23).

Being connected to the same word lines 13, cells 61 of the group memory sector use the same row decoder 19 as cells 3.

Consequently, when memory device 55 is turned on, as for the initial loading procedures already provided, cells 61 of group memory sector 51 are read by the column decoder (portion 63 of column decoder 60) and the content of cells 61 is memorized in registers 44. In all the following operating steps of the device, registers 44 then operate as described above with reference to FIG. 4 as regards control of elementary sectors 4.

The grouping of elementary sectors 4 may be altered by modifying the correlation map in group memory sector 51. Instead of redesigning the whole of device 55, this is done by simply reprogramming sector 51 by erasing it using respective switch 54, as for any other elementary sector 4, and memorizing i.e., programming, a different correlation.

Memory device 55 may therefore be adapted before initial use, according to the specific requirements of the application in question, as well as after initial use, should different requirements arise.

Clearly, changes may be made to the memory device and method as described and illustrated herein without, however, departing from the spirit and scope of the present invention. In particular, correlation unit 31 (FIG. 3) may be formed differently, e.g., directly by a nonvolatile memory element or by a special logic or combining circuit. The correlation unit 31 may also generate directly the control signals for source switches 25, as described, or coded address signals for the elementary sectors. In the latter case, referring to FIG. 4, the correlation unit 41 requires a special decoding element which may be located at the input, instead of the output, of the enabling selector 26.

We claim:

1. A memory circuit, comprising:
   a memory array having elementary memory sectors that each include a nonvolatile memory cell;
   erase switches that are each coupled to a respective one of said elementary memory sectors;
   correlating registers that each define a respective composite memory sector by identifying one or more of said elementary memory sectors that compose said respective composite memory sector, said each correlating register being coupled to multiple erase switches including at least those of said erase switches that are respectively coupled to said one or more elementary memory sectors that compose said respective composite memory sector;
   a control unit; and
   a composite-memory-sector selector coupled to said control unit and to each of said correlating registers.

2. The memory circuit of claim 1 wherein said each correlating register comprises bit locations that are each coupled to a respective one of said erase switches, each bit location storing a first value if a respective elementary sector belongs to said respective composite memory sector, said each bit location storing a second value if said respective elementary sector does not belong to said respective composite memory sector.

3. The memory circuit of claim 1, further comprising a nonvolatile correlation memory that is coupled to each of said correlation registers.

4. A memory circuit, comprising:
   a memory array having a group memory sector that includes a first column line and nonvolatile memory cells that are each coupled to said first column line, said memory array having elementary memory sectors that each include a respective second column line and respective nonvolatile memory cells that are coupled to said respective second column line;
   elementary-memory-sector erase switches that are each coupled to a respective elementary memory sector of said memory array;
   a group-memory-sector erase switch that is coupled to said group memory sector of said memory array;
   a column decoder coupled to said first and second column lines of said group and elementary memory sectors;
   a sense amplifier coupled to said column decoder;
   correlating registers that are each coupled to said sense amplifier and to said elementary-memory-sector erase switches, each correlating register storing data that identifies those of said elementary memory sectors that compose a respective composite memory sector;
   a control unit that is coupled to said sense amplifier, said control unit including a group setting unit that is coupled to said column decoder, said correlating registers, and said group-memory-sector erase switch; and
   a composite-memory-sector selector coupled to said control unit and to said correlating registers.

5. The memory circuit of claim 4 wherein each of said correlating registers has bits that are each coupled to bits of corresponding significance in the other correlating registers and to a respective one of said elementary-memory-sector erase switches.

6. A method for accessing an array of nonvolatile memory cells that are arranged in elementary sectors that each include at least one of said memory cells, the method comprising:
   grouping said elementary sectors of said memory cells into a plurality of respective composite sectors of said memory cells, each of said composite sectors including at least one of said elementary sectors;
   storing in a respective correlation memory for each of said composite sectors the identity of those of said elementary sectors that are included in said each composite sector, said respective correlation memory coupled to more than one of said elementary sectors; and
   erasing together those of said memory cells that are included in a respective one of said composite sectors.

7. The method of claim 6 wherein said erasing comprises:
   generating a composite-sector address signal;
   addressing said respective one of said composite sectors with said address signal;
   generating a plurality of elementary-sector address signals, one for each of said elementary sectors that is included in said respective one of said composite sectors; and
   addressing said included elementary sectors with said elementary-sector address signals.

8. A nonvolatile memory device comprising:
   a memory array formed of a plurality of memory cells grouped into respective elementary sectors;
   wherein said elementary sectors are grouped into respective composite sectors that include at least one elementary sector; and
   wherein said memory device comprises correlating means for memorizing the correlation between each composite sector and the elementary sectors in said each composite sector, said correlating means including correlating memories that each memorize the correlation for a respective composite sector and that each are associated with more than one of the elementary sectors.

9. A device as claimed in claim 8 wherein the memory cells in the same elementary sector present a terminal connected to a common line.

10. A device as claimed in claim 9 wherein each memory cell includes a source terminal, a drain terminal, and a control terminal; said source terminal being connected to said common line.

11. A device as claimed in claim 8 wherein said correlating means comprise a plurality of inputs supplied with group selection signals, each specifying a respective composite sector; said correlating means generating sector address signals for addressing the elementary sectors in the respective composite sector corresponding to the received group selection signal.

12. A device as claimed in claim 8 wherein said correlating means comprise a volatile memory and a permanent memory, the volatile memory including the correlating memories.

13. A device as claimed in claim 12 wherein said volatile memory comprises a plurality of registers, each formed of a plurality of memory units and each composing a respective one of said correlating memories; and each said memory unit being associated with a respective elementary sector and memorizing the correlation between the composite sector associated with the respective register and said respective elementary sector.

14. A device as claimed in claim 12 wherein said permanent memory comprises a flash-EEPROM memory.

15. A device as claimed in claim 12 wherein said permanent memory comprises an EEPROM memory.

16. A device as claimed in claim 12 wherein said permanent memory comprises a read-only memory.

17. A device as claimed in claim 12 wherein said permanent memory is disposed in said memory array.

18. A device as claimed in claim 17 wherein said permanent memory comprises a plurality of correlation memory cells with respective drain terminals connected to correlation bit lines.

19. A device as claimed in claim 18 wherein said memory cells are connected to respective bit lines; said device comprising a column decoding unit having an input connected to said bit lines and outputs connected to output lines; wherein said device comprises a correlation column decoding unit having an input connected to said correlation bit lines and outputs connected to said output lines.

20. A device as claimed in claim 18 wherein said correlation memory cells present respective source terminals connected to a common correlation source line connected to a respective bias switch.

21. A method of addressing a nonvolatile memory device as claimed in claim 8 wherein the method comprises the steps of dividing said memory device into a plurality of elementary sectors; grouping said elementary sectors into a plurality of composite sectors; and memorizing the correlation between each said composite sector and said elementary sectors with correlation registers that each memorize the correlation for a respective one of said composite sectors and that are each coupled to multiple elementary sectors.

22. A method as claimed in claim 21, further comprising the steps of generating a composite sector address signal for addressing one of said composite sectors; detecting said memorized correlation; and generating an elementary address signal for each elementary sector in said addressed composite sector.

\* \* \* \* \*